United States Patent [19]

Osburn

[11] Patent Number: 5,404,098
[45] Date of Patent: Apr. 4, 1995

[54] METHOD AND APPARATUS FOR IMPROVED CORRELATION OF ELECTROMAGNETIC EMMISSION TEST DATA

[75] Inventor: John D. M. Osburn, Austin, Tex.

[73] Assignee: The Electro-Mechanics Company, Austin, Tex.

[21] Appl. No.: 930,770

[22] Filed: Aug. 14, 1992

[51] Int. Cl.⁶ .............................................. G01R 27/02
[52] U.S. Cl. ..................................... 324/95; 324/627; 343/703
[58] Field of Search .............. 174/35 MS; 324/72, 95, 324/627; 340/600; 343/703; 455/67.1, 115

[56] References Cited

U.S. PATENT DOCUMENTS

| | | | |
|---|---|---|---|
| 4,588,993 | 5/1986 | Babit et al. | 343/703 X |
| 4,837,581 | 6/1989 | Hansen et al. | 343/703 |
| 4,968,983 | 11/1990 | Maeda | 343/703 |
| 5,053,712 | 10/1991 | Hansen | 324/627 |

OTHER PUBLICATIONS

Weiss, D.; "A User's Insight into Radiated Emission Testing With GTEM Cells"; Aug. 1991; IEEE; pp. 157–161.
Bronaugh, E. L., et al; "Radiated Emissions Test Performance of the GHz TEM Cell"; Aug. 1991; IEEE; pp. 1–7.
Garbe, H., et al.; "The GTEM Cell Concept; Applications of this New EMC Test Environment to Radiated Emission and Susceptibility Measurements"; Aug. 1990; IEEE; pp. 152–156.
Abstract: P. Wilson, D. Hansen and D. Koenigstein; "Simulating Open Area Test Site Emission Measurements Based On Data Obtained In a Novel Broadband TEM Cell"; IEEE (1989), pp. 1–7; May 1989.
Kraus, John D., "Antennas"; McGraw-Hill Dec. (1950), pp. 10–31.

Primary Examiner—Walter E. Snow
Assistant Examiner—Christopher M. Tobin

[57] ABSTRACT

An improved correlation method that computes E field measurements from voltage measurements produced by a TEM cell. Twelve voltage measurements are taken of radiation emanating from a device under test (DUT) for respective frequencies. The measurements are taken for the six faces of a hypothetical cube enclosing the DUT in both polarizations. Using these 12 measurements, the method identifies the face and polarization of the DUT which produces the highest emanation of radiation at that respective frequency. The method obtains three input voltages from these measurements and determines if the assumption of a dipole gain is adequate. If not, the actual gain is calculated and is used in a 3-input correlation algorithm to obtain more correct data regarding the E field emission of the DUT.

25 Claims, 13 Drawing Sheets

METHOD AND APPARATUS FOR IMPROVED CORRELATION OF ELECTROMAGNETIC EMMISSION TEST DATA

SPECIFICATION

1. Field of the Invention

The present invention relates generally to an apparatus for measuring electromagnetic (EM) emissions from an electronic device. More specifically, the present invention comprises an improved correlation method which more clearly approximates the electromagnetic emissions from a device under test (DUT) when the DUT cannot be accurately modeled as a simple dipole.

2. Description of the Related Art

All electronic devices such as computer systems, hair dryers, television sets, microwave ovens, etc. generate electromagnetic (EM) emissions of varying degrees. Certain federal agencies, such as the Federal Communications Commission (FCC), require the measurement of EM emissions from electronic or electromechanic devices in order to guarantee that these devices are not radiating EM emissions above specified limits. These limits are generally based upon open area test site (OATS) measurement standards. The OATS is the accepted standard for measuring EM emissions from electronic or electromechanical devices.

An open area test for EM emissions requires that the device be taken to an open field away from power lines and other devices which generate EM emissions. As shown in FIG. 1, the device under test (DUT) is usually placed on a turntable and rotated relative to an antenna. The antenna records the amount of electromagnetic emissions for varying heights of the antenna and various positions of the DUT on the turntable. However, testing an electronic or electromechanic device using an OATS is generally burdensome and expensive in that the test site is often a considerable distance from where the devices are produced. In addition, an open area test as shown in FIG. 1 can only test for EM emissions for a segment of the spherical volume surrounding the DUT. Therefore, transverse electromagnetic (TEM) cells are often used to measure radiated EM emissions from electronics devices.

One popular type of TEM cell is the Gigahertz transverse electromagnetic cell (GTEM). The GTEM essentially comprises a pyramid-shaped waveguide whose "base" end is formed of a wall of high frequency peak absorbers. Physically, the GTEM looks like a four-sided pyramid lying on its side. Electrically, a TEM cell such as the GTEM can be modeled as a linearly expanding 50 ohm rectangular transmission line. The DUT is placed inside the TEM cell close to the base end. Because a TEM cell can only measure EM emissions in a direction perpendicular to its longitudinal axis, a DUT is generally repositioned during testing in such a way as to measure the three mutually orthogonal vector components of these emissions. This repositioning involves rotating and tilting the device to change its orientation relative to the cell's longitudinal axis. Three sets of measurements are made by the TEM cell along each of the axes to produce three corresponding voltages, referred to an $V_x$, $V_y$, and $V_z$. These three voltages are made for a plurality of frequencies. These three voltage values are then mathematically correlated to produce E-field data, which may then be compared to an appropriate OATS standard.

Background on correlation algorithms that are used to compute OATS equivalent information from TEM cell voltage measurements is deemed appropriate. A popular correlation algorithm that is currently used may be referred to as a 3-measurement 3-input correlation algorithm. This correlation algorithm computes the equivalent values of the electromagnetic field as would be measured from the same DUT at an OATS from three voltage measurements made at three orthogonal positions of the DUT in the TEM cell. In order to obtain these voltage measurements, the DUT is placed first in a reference position and then rotated to two subsequent orthogonal positions such that the positive axes are interchanged in the rotation sequence:

| X | Y | Z |
| Y | Z | X, |
| Z | X | Y. |

The correlation algorithm according to the prior art requires that the two subsequent rotations to obtain the Y and Z voltage measurements be accomplished in the above manner. For more information on this correlation algorithm, please see Wilson, Hansen and Koenigstein, "Simulating Open Area Test Site Emission Measurements Based on Data Obtained in a Novel Broadband TEM Cell," IEEE 1989 National Symposium on EMC, Denver, CO May 2325, 1989.

These three voltage measurements are made for a large number of frequencies. Once the measurements are completed, the frequency and the three voltages, along with data describing the DUT location on the TEM cell and the characteristics of the desired correlation, are used as inputs to the correlation algorithm. The output of the correlation algorithm is data that can be directly compared to typical radiated emissions specification limits published by national and international regulatory authorities.

The primary assumption in the current correlation algorithm is that the specific emanations source in the DUT can be replaced at any frequency by an equivalent radiator whose characteristics are those of a tuned, resonant dipole. A central assumption is made that the equivalent radiator has a gain no greater than a dipole. However, experimentation has shown that this fundamental assumption is not accurate for certain frequencies, particularly as frequencies of the measured emission increase above several hundred MHz. When the voltage measurements are made in a TEM cell over a large number of frequencies, the assumption that the DUT has a gain no greater than a dipole is generally adequate for most of the measured frequencies. However, for certain frequencies, especially those above 1 GHz, this assumption is inadequate, producing erroneous results. The occurrence of erroneous results has presented a problem with acceptance by government agencies of the TEM cell as a replacement for OATS methods. In addition, engineers skilled in this field of art have been unable to solve this problem and obtain more accurate EM field measurements when the DUT cannot be accurately modeled as a simple dipole. Therefore, an improved correlation method is necessary which accurately correlates TEM cell voltage measurements into the equivalent EM field values and which is not limited by the assumption that the radiator in the DUT has a gain no greater than a dipole.

The majority of electromagnetic compatibility (EMC) specifications are directed toward a comparison of the strength of the EM field generated by the DUT to the specification limits. In other words, the specification limits are compared directly with the EM field produced by the DUT. However, some EMC specifications have a differing requirement than the direct comparison of electromagnetic field strength produced by a DUT, as measured on an OATS or in a TEM, to a specification requirement. According to these other types of specifications, a measurement of a specific emanation from the DUT is made, and then the DUT is physically replaced with a resonant "standard" dipole tuned to the same frequency. The input power to the dipole is then adjusted to give the same indication on the measurement instrumentation, i.e., the antenna, as the DUT did at that frequency. The specification limit values are in terms of the power input to the "standard" dipole to produce the same indication. The input power required to produce the same EM field measurement from the dipole is then compared against the specification limit values.

Experimentation with measurements using this specification has also revealed that the fundamental assumption that the emanating element in the DUT has a gain no greater than a dipole may not be accurate above certain frequencies. In particular, it has been found that the correlation algorithm results are sensitive to the starting position, or reference position, where the initial measurement is made. For those EMC specifications of the type where the DUT is physically replaced with a dipole, the assumption that the DUT has a gain no greater than a dipole is inherent from the specification and is thus required. Therefore, a method and apparatus is desired to determine the optimum starting position or reference position of the DUT in order to obtain more accurate measurements of E field emissions produced by the DUT.

SUMMARY OF THE INVENTION

The present invention comprises several embodiments of an improved correlation method that computes EM field data from voltage measurements taken by a TEM cell. The method overcomes inaccuracies resulting from the assumption that the DUT can be accurately modeled as a dipole with a gain no greater than a dipole for all frequencies.

One embodiment is adapted for use with EMC specifications where the DUT is replaced with a physical dipole and the power input to the dipole is adjusted to provide the same E field measurement as the DUT at the respective frequency. In this embodiment, twelve voltage measurements are taken of EM radiation emanating from the DUT for respective frequencies of interest. These 12 measurements comprise measurements of all six faces of a hypothetical cube enclosing the DUT in both polarizations. The rotation of the DUT to obtain these measurements is performed in a novel and efficient manner which prevents the electric power and signal cables of the device from obstructing the rotation. Using these 12 measurements, the method identifies the position of the DUT, i.e., the face and polarization, which produces the highest emanation of radiation at that respective frequency. Using this face and polarization as the reference position, the method obtains the Y and Z voltages previously measured using the rotation sequence for the three input correlation algorithm.

The method then uses these three voltages in the 3-input correlation algorithm to compute the E field data.

The selection of the starting DUT reference position as the position that has the highest emanation of EM radiation produces the most accurate EM field data when the dipole assumption is made. In other words, the proper selection of the starting face and polarization allows the constraint of gain no greater than dipole to be met and still provides very accurate data. Upon obtaining the E field results from the 3-input correlation algorithm, the method then computes the power required to be provided to the dipole to produce the equivalent E field radiation. This power is then provided as an output to be compared against specification limits.

The second embodiment is intended for those specifications where the E field data is compared directly against the specification limits. This second embodiment does not assume that the DUT can be accurately modeled as a dipole with a gain no greater than a dipole for all frequencies. The method according to this embodiment estimates the gain of the DUT and substitutes this gain for the gain of the radiating element in the 3-input correlation algorithm for those frequencies where the assumption of a gain no greater than a dipole is not accurate.

In this embodiment, twelve measurements are taken from the DUT for each of the six faces and two polarizations as was described above, and the face and polarization with the highest emissions are designated as the reference position. The method then obtains the remaining two voltage measurements for the 3-input correlation algorithm as was described above. The method then determines if a dipole assumption is adequate for the respective frequencies of interest. If so, then the dipole assumption is used in the correlation algorithm for these frequencies as would normally be done.

For those frequencies where the assumption is not accurate, the additional measurements are made at the same polarization at approximately ±45° to the reference face and at approximately ±45° cross polarized to the reference face, and these measurements are used to obtain an estimate of the vertical and horizontal beam widths. The beam width is then used to calculate the gain of the DUT. This gain estimation replaces the value of the gain of a dipole in the correlation algorithm, thus yielding significantly more accurate E field data where the dipole assumption cannot be made.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

TEM Cell

Figure 2:
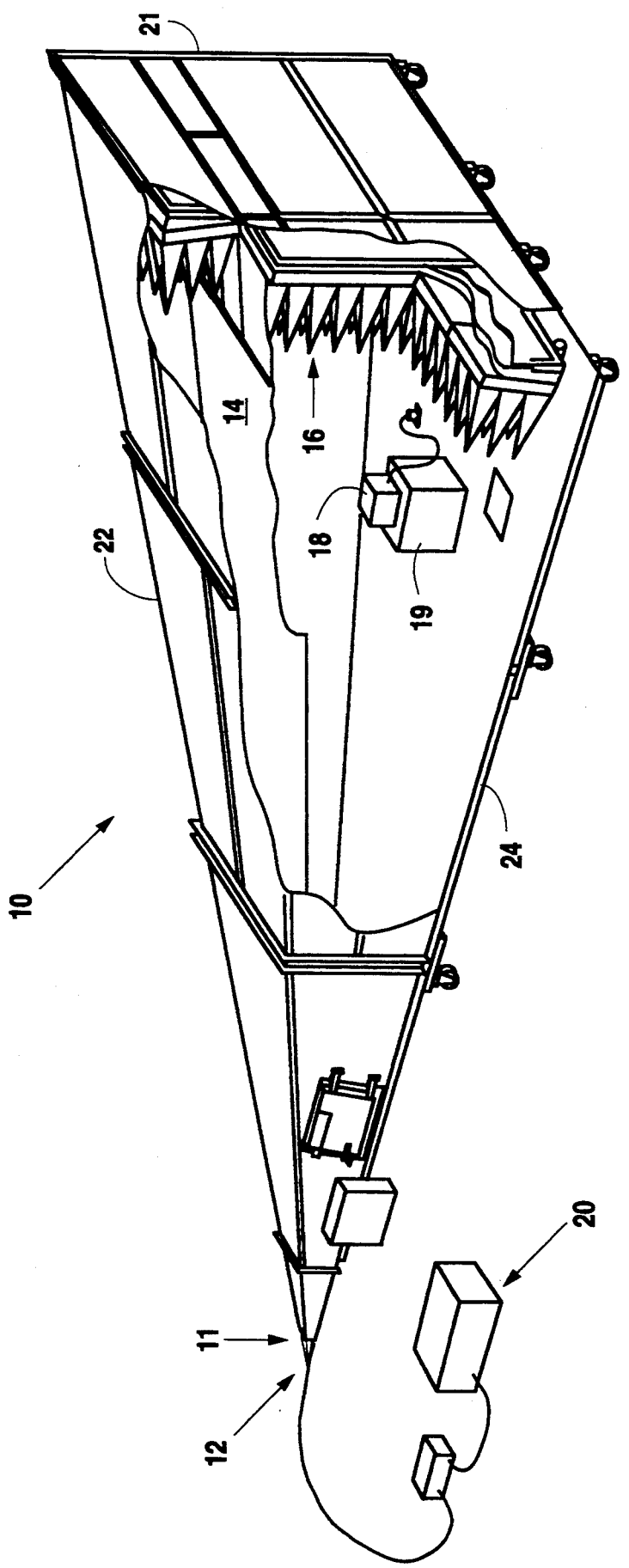
FIG. 2 illustrates a cross-sectional side view of a transverse electromagnetic (TEM) cell of the type used in the preferred embodiment.

Referring now to FIG. 2, a TEM cell of the type employed in the preferred embodiment is shown. Details relating to the construction and operation of such a TEM cell are provided in U.S. Pat. No. 4,837,581, issued to Hansen et al. on Jun. 6, 1989, which is hereby incorporated by reference.

As shown in FIG. 2, the TEM cell is preferably a Gigahertz transverse electromagnetic cell (GTEM), which has a generally pyramidal shape with a rectangular cross-section. The TEM cell is positioned with its apex 11 at one end and its base 21 at another. The device under test (DUT) 18 is supported on a platform 19 in the interior of the TEM cell at a location within the central test volume. The exact location of the test volume depends on the physical dimensions of the particular TEM cell. By way of example, the TEM cell used in the preferred embodiment has an angle of 20 degrees between roof 22 and floor 24 and an angle of 15 degrees between the septum 14 (center conductor) and the floor 24. A door (not shown) is included on the near wall (not shown) of the TEM cell, i.e., the door is on the left of the TEM cell as viewed from the DUT 18 as the DUT 18 is facing the apex 11.

The TEM cell may be used for either emissions or immunity testing of the DUT 18, as desired. For immunity testing, a source such as a pulse or sinusoidal generator (not shown) is positioned at the apex 11 of the TEM cell. An electric field is directed along the longitudinal axis of the TEM cell from the source at the vertex 11 to the DUT 18 and terminating at an absorber wall 16. The absorber wall 16 is comprised of a plurality of pyramid-shaped radio frequency absorbers which are appropriately terminated to provide a desired impedance value. The results of this immunity testing may then be provided to monitoring instrumentation (not shown).

In the preferred embodiment, the TEM cell is configured for emissions testing of the DUT 18. Although the TEM cell is often used to measure the effect of electric fields on a DUT 18, i.e., immunity testing, the TEM cell can also be used to measure the radiation emitted by the DUT 18. The EM emissions of an electronic device are the result of the additive contribution of the many circuit elements composing the device which act like antennas and radiate EM energy.

When configured for emissions testing, the EM emissions output from the DUT 18 are provided toward the apex 11 of the TEM cell and produce corresponding voltage differences between the septum 14, i.e., center conductor, and the outer wall of the TEM cell. These voltage values are provided through a coaxial cable 12 at the apex 11 of the TEM cell to a computer system 20, as shown. The computer system includes the improved correlation methods according to the present invention which are preferably implemented in software. In the preferred embodiment, the software is written in the MicroSoft Excel macro language.

Figure 3:
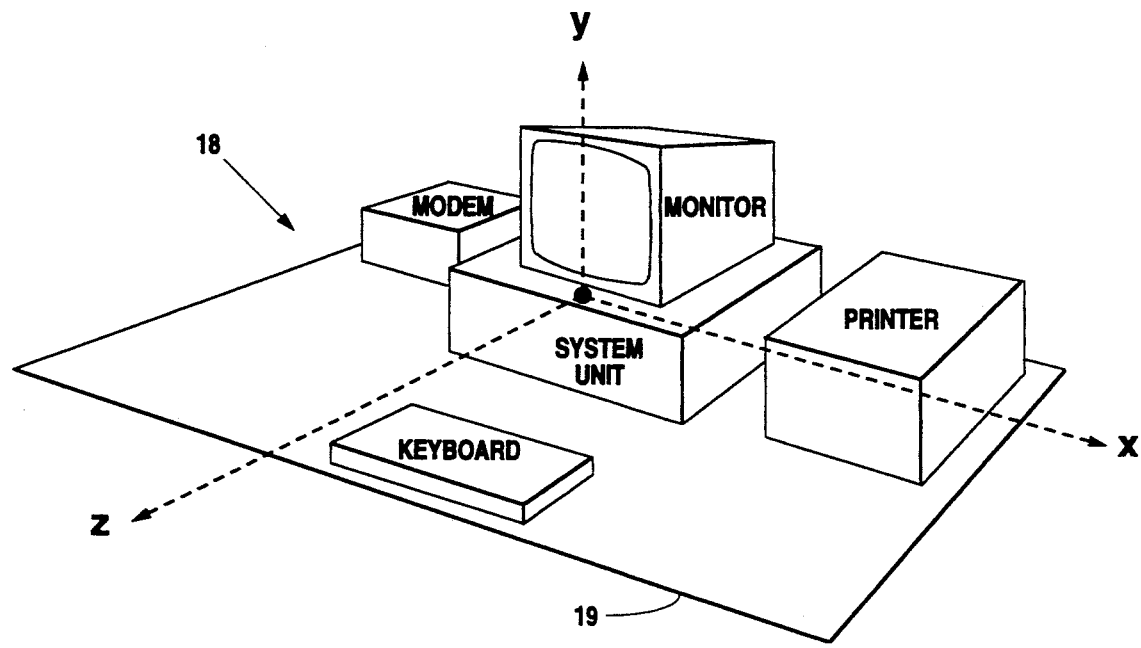
FIG. 3 illustrates the orthogonal axes of a device under test (DUT)
Figure 4:
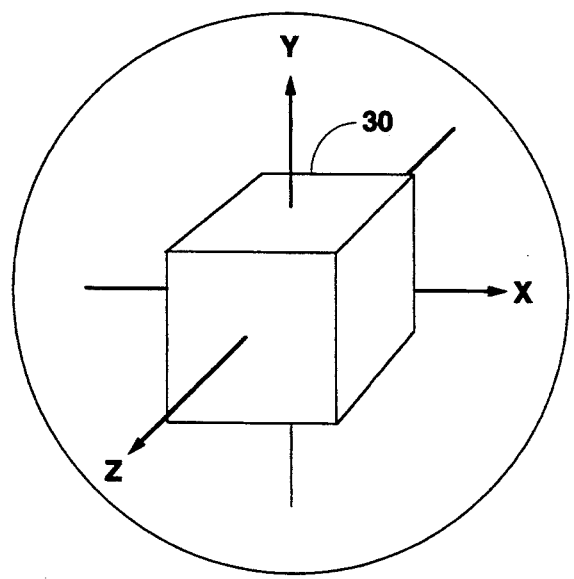
FIG. 4 illustrates a hypothetical cube that is used to conceptualize rotation of the DUT.

Any circuit element of a device that emits radiation can have its emission characterized by one or more vectors. Referring now to FIG. 3, in performing an EM emissions test of a DUT, such as a computer system, a right-handed rectangular coordinate system with X, Y and Z axes may be associated with the physical dimensions of the DUT 18. The TEM cell is able to take measurements along only one axis at a time. Therefore, to actually measure EM radiation from each of the desired positions of the DUT 18, the DUT 18 must be repositioned so that each of the desired "faces" of the DUT 18 are successively aligned with the measurement axis of the TEM cell. As shown in FIG. 4, it is helpful to conceptualize a hypothetical cube 30 in place of the DUT 18 with X, Y and Z axes passing through the cube in order to conceptualize the rotation involved.

Figure 5:
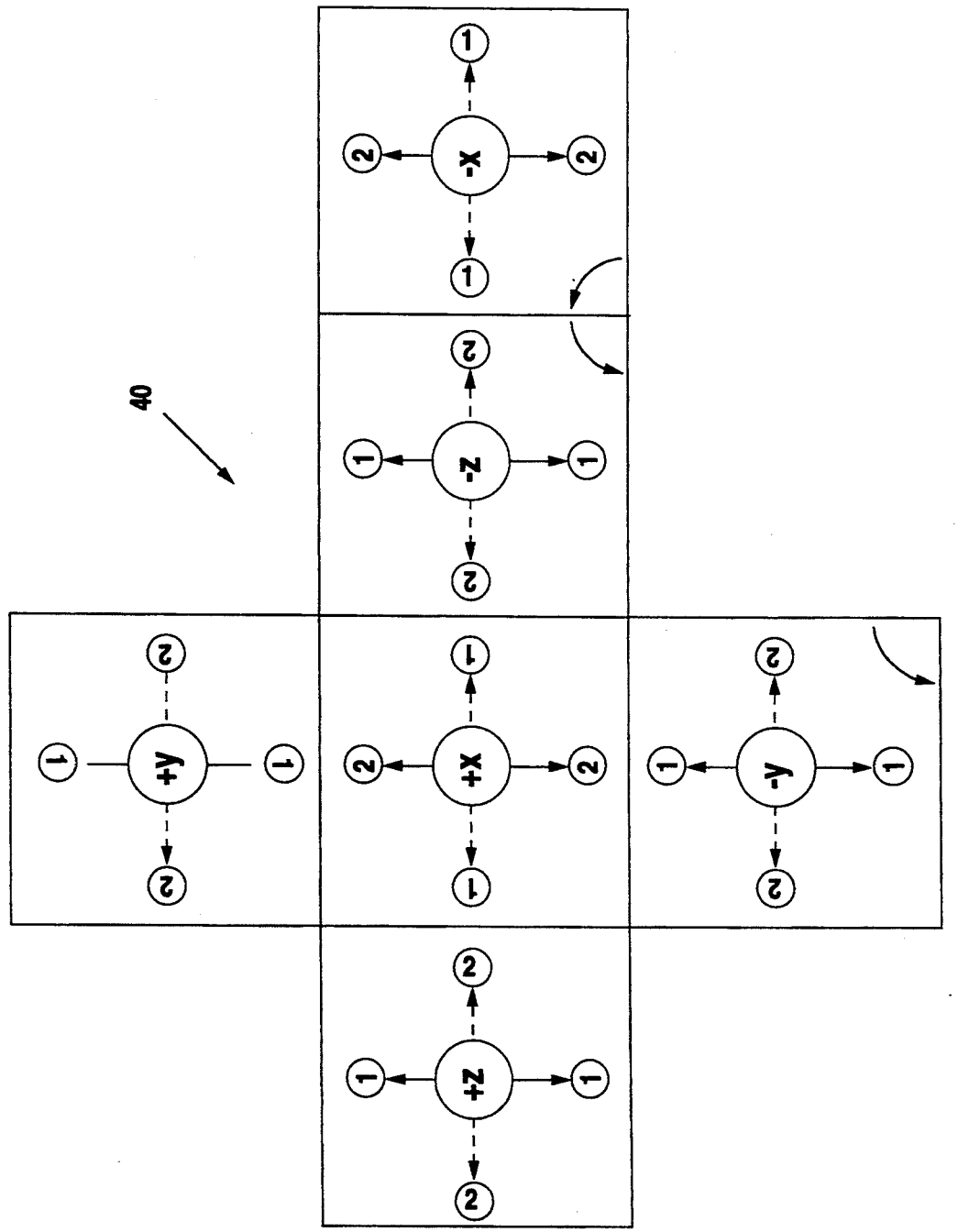
FIG. 5 illustrates hypothetical cube face designations in a two-dimensional plane that are used to conceptualize rotation of the DUT.
Figure 6A:
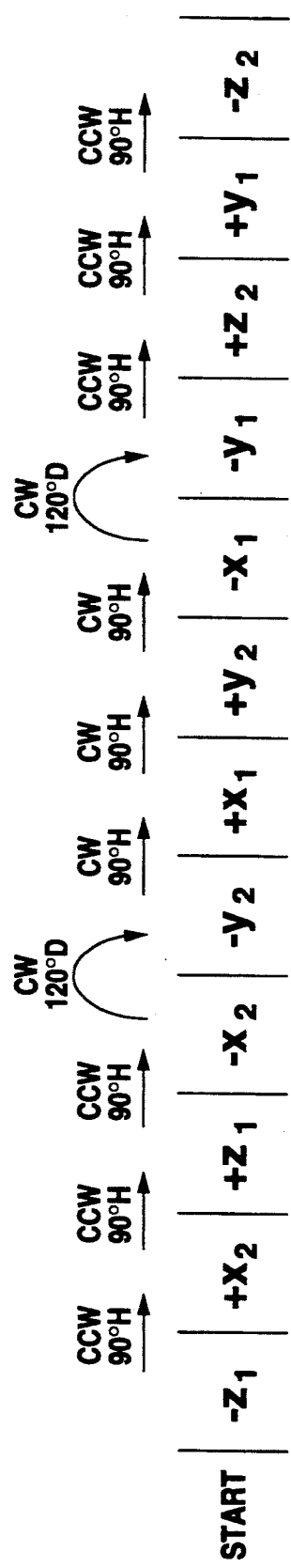
FIG. 6 illustrates a rotation sequence of the cube of FIG. 5 to obtain 12 voltage measurements.
Figure 6B:
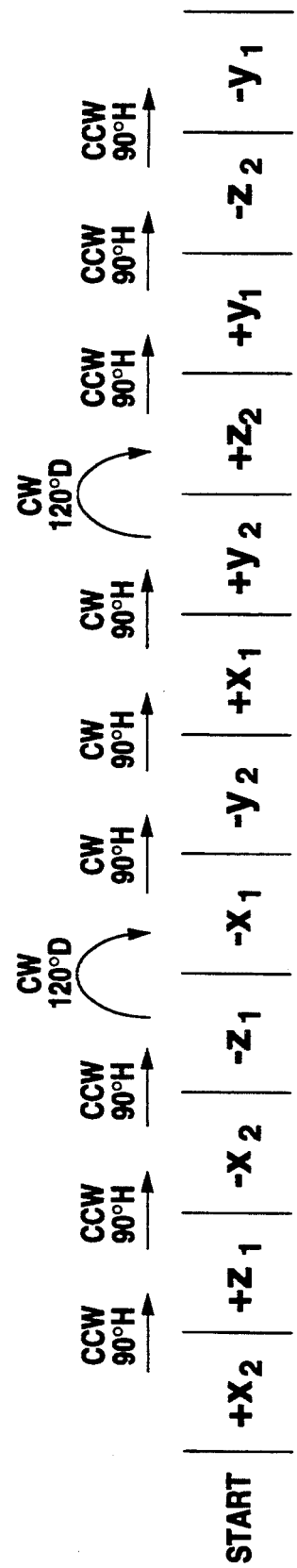

FIGS. 5 and 6—Rotation Sequence

As described in the background section, prior art methods contemplate 3 measurements of the E field produced by the DUT 18, one measurement along each axis, respectively. According to the present invention, 12 measurements are taken of the respective DUT. These measurements are taken along each of the 6 faces of a hypothetical cube enclosing the DUT 18 as well as both polarizations for each face of the cube. Referring now to FIG. 5, a hypothetical cube 40 is shown with the six faces of the cube laid out in a single plane for convenience. The cube face that would be facing the viewer if the faces were properly connected or folded to form a cube is designated as "+X", with the remaining faces extended out in a single plane so that all of the cube faces may be viewed in one diagram. The respective faces of the cube are referred to as $+X$, $-X$, $+Y$, $-Y$, and $+Z$, $-Z$. The faces labeled $+X$, $+Y$ and $+Z$ are directly opposite of the corresponding faces $-X$, $-Y$ and $-Z$, respectively, when the faces are connected or folded together to form the cube 40. In addition, the number one ("1") is used to designate one polarization of each cube face, as shown, and the number two ("2") is used to designate the other polarization of each cube face, as shown.

It is helpful to envision rotation of the DUT 18 as rotation of the cube 40 to better conceptualize the rotation that occurs. Referring now to FIG. 6, the rotation sequence used in the preferred embodiment to obtain the twelve measurements of the DUT 18 is shown. When a respective subscript, either "1" or "2", is used, this indicates that the polarization represented by the subscript is in the vertical plane of the TEM cell, i.e., at the top and bottom of the cube 40 as viewed from the apex 11. The letter H used in FIG. 6 represents the horizontal plane in the TEM cell. The letter D used in FIG. 6 represents a diagonal axis between the $+X$, $+Y$, and $+Z$ corner and the $-X$, $-Y$, and $-Z$ corner. The letters "CW" and "CCW" represent clockwise and counter-clockwise, respectively.

When the DUT 18 is placed in the TEM cell, the cube face designated as $+X_2$ is designated as the face shown as viewed from the apex 11 of the TEM cell. The cube is then rotated counterclockwise 90° in the horizontal plane so that the face $+Z_1$ is showing, and the subsequent measurement is taken. The cube is then rotated counterclockwise 90° in the horizontal plane to view the $-X_2$ cube face, and then rotated 90° counterclockwise in the horizontal plane to view the $-Z_1$ cube face and then the cube is rotated clockwise 120° about the diagonal axis D to view the $-X_1$ cube face and then clockwise 90° in the horizontal plane to view the $-Y_2$ face and then clockwise 90° in the horizontal plane to view the $+X_1$ face and then clockwise 90° in the horizontal plane to view the $+Y_2$ face and then clockwise 120° about the diagonal axis D to view the $+Z_2$ face and then counterclockwise 9° in the horizontal plane to view the $+Y_1$ face and then counterclockwise 90° in the horizontal plane to view the $-Z_2$ face and finally counterclockwise 90° in the horizontal plane to view the $-Y_1$ face. Thus, the cube faces $+X_2$, $+Z_1$, $-X_2$, $-Z_1$, $-X_1$, $-Y_2$, $+X_1$, $+Y_2$, $+Z_2$, $+Y_1$, $-Z_2$, and $-Y_1$, respectively, are viewed from the apex 11 of the TEM cell in the preferred embodiment. The corresponding cube faces that are viewed from the door of the TEM cell during the above rotations is also shown in FIG. 6. This sequence of rotations provides that the DUT 18 may be rotated such that the electric cord powering the device is not wrapped around the device and further, that the DUT 18 is not required to be unplugged during any of these rotations. Thus, this sequence of rotations provides the most optimal and efficient way to gather the 12 desired measurements according to the present invention.

Two Embodiments of the Invention

Either of two embodiments of the invention may be used, preferably depending on which EMC specification is being used. One embodiment of the invention makes an assumption that the DUT can be replaced by an equivalent radiator whose characteristics are those of a tuned resonant dipole at any frequency. Thus an assumption is made in this embodiment that the equivalent radiator has a gain no greater than a dipole. The second embodiment makes no assumptions as to gain, but rather determines if a dipole is an accurate approximation of the DUT at each frequency. If a dipole is an accurate approximation, then a dipole model is used. If the method determines that a dipole is not an accurate approximation, then the method estimates the actual gain of the DUT 18 and uses this gain in the 3-input correlation algorithm.

As described in the background, some EMC specifications require that an operator physically replace the DUT 18 with a physical dipole and then compare the input power to the dipole required to provide the same E field measurement with the specification limits. When specifications of this type are used, the first embodiment of the invention is preferably used because the assumption that the DUT has a gain no greater than a dipole is inherent in the specification. Since this type of specification presumes replacing the DUT with a physical dipole, use of a gain greater than that of a dipole would produce erroneous results. In specifications where the specification limits are compared directly against the E field strength produced by the DUT 18, the second embodiment is preferably used. The second embodiment generally produces more accurate results than the first because the second embodiment is not limited by assumptions that gain is no greater than a dipole. It is noted, however, that the first embodiment may also be used for this type of specification.

As previously discussed, each of these methods utilizes a three input correlation algorithm. The 3-input correlation algorithm receives three voltage measurements from the TEM cell and generates corresponding E field data for the DUT 18. For more information on this correlation algorithm, please see Wilson, Hansen and Koenigstein, "Simulating Open Area Test Site Emission Measurements Based on Data Obtained in a Novel Broadband TEM Cell," IEEE 1989 National Symposium on EMC, Denver, CO May 23-25, 1989, which is hereby incorporated by reference. The correlation algorithm is also available in a software routine provided by EMCO Corporation which can be reached at P.O. Box 1546, Austin, Tex. 78767 and at telephone number (512) 835-4684.

First Embodiment

Turning now to the first embodiment, There are twelve possible starting positions for the three position measurement that is provided as an input to the three input correlation algorithm. Only one of these starting positions gives correct data as would be actually measured on an OATS. Where the specification limits are in terms of power input to a tuned dipole, the correct X, Y and Z inputs, i.e., the proper selection of the starting position, allows the constraint of gain no greater than a dipole to be met and still provides correct data. The method according to the first embodiment computes the E field from each of the twelve positions of the hypothetical cube 40 modelling the DUT 18 to determine the correct starting position and thus allows the development of technically correct data while maintaining the correlation algorithm requirement that the emanating element have a gain no greater than a dipole.

Figure 7A:
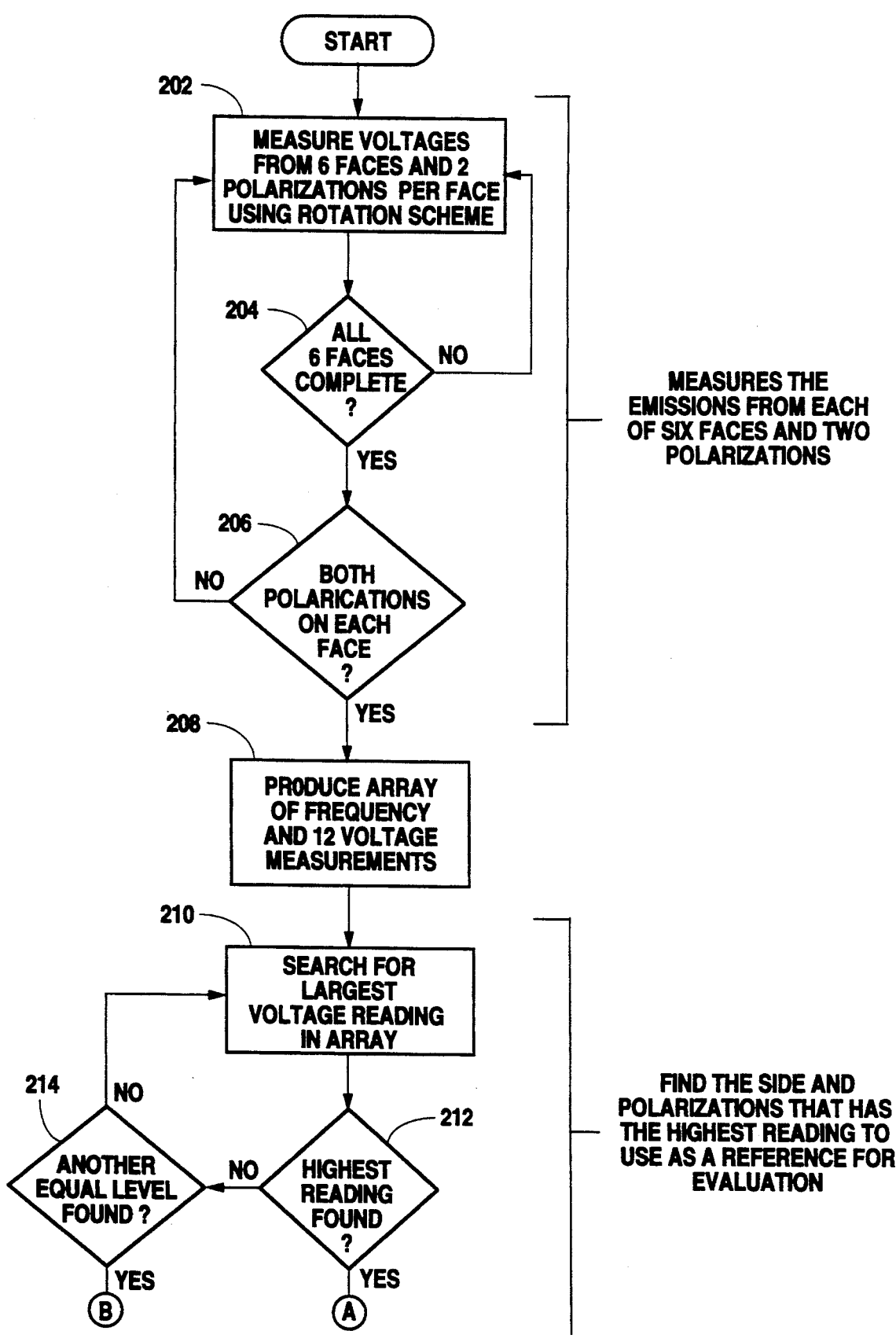
FIGS. 7A-7C are flowchart diagrams illustrating operation of the correlation method according to one embodiment of the present invention.
Figure 7B:
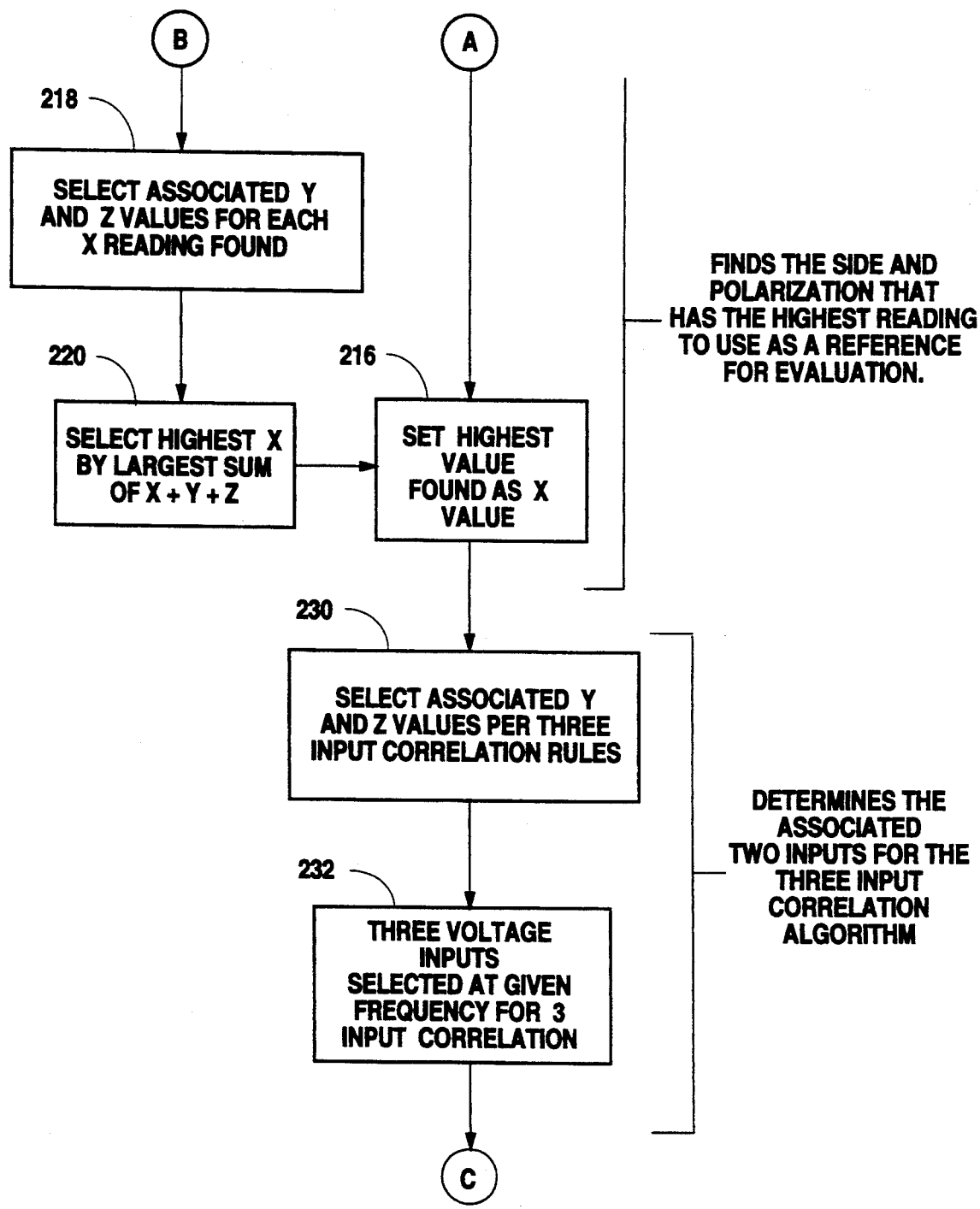
Figure 7C:
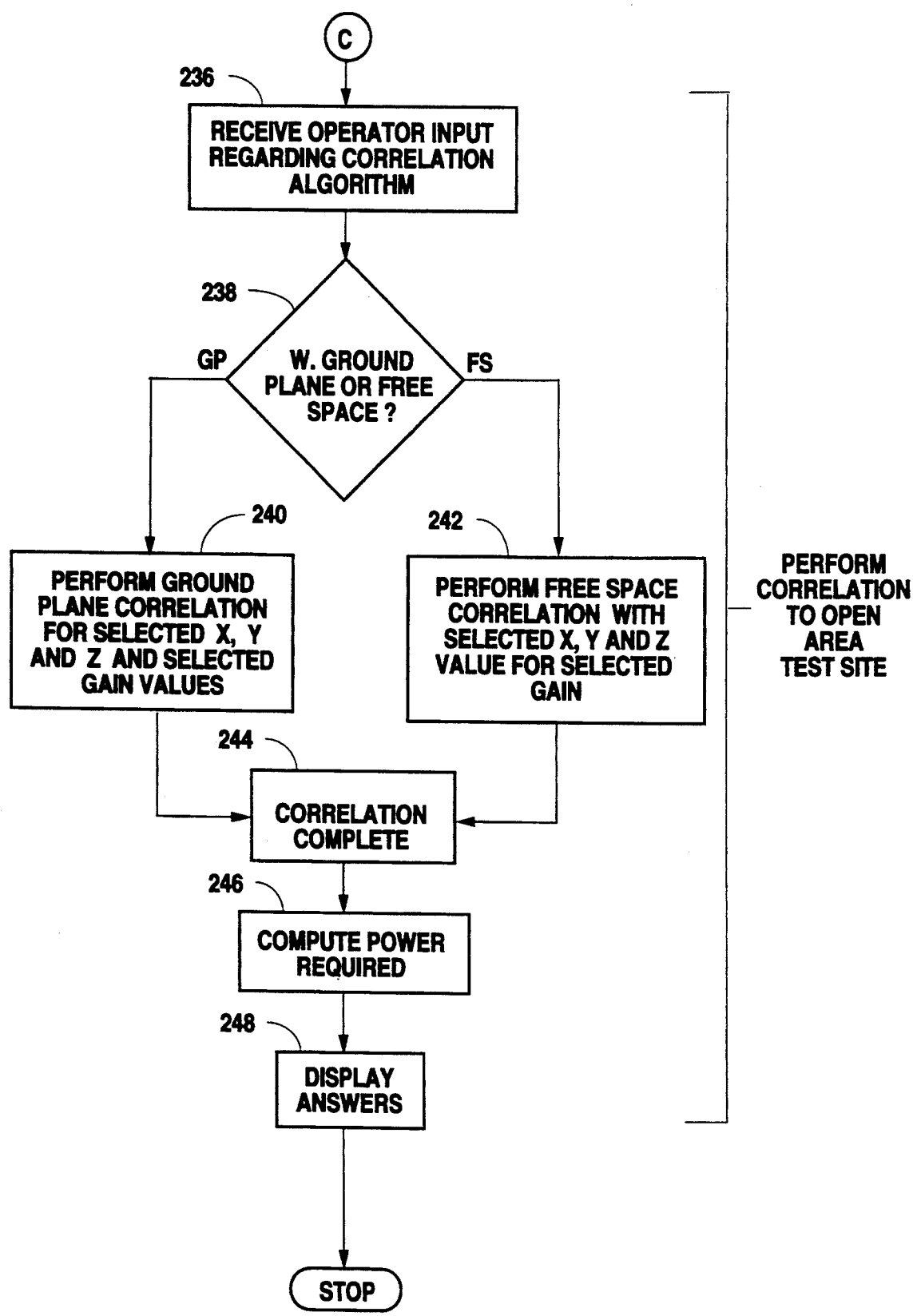

Referring now to FIGS. 7A–7C, the method according to the first embodiment is shown. FIG. 7 is shown in three portions referred to as FIGS. 7A, 7B, and 7C, and interconnections of the flowchart are designated by reference to the circled letters A–C. In step 202, the correlation method measures respective voltages from a respective face and polarization for all the desired frequencies of interest using the rotation scheme described above. For example, in one embodiment of the invention, the method measures in the range from 30 MHz to 20 GHz, obtaining 22,000 frequency measurements for each position.

In step 204, the method determines if the measurements for all six faces have been completed. If not, the method returns to step 202 to continue measuring the voltages from each of the respective faces. If all six faces have been completed in step 204, then in step 206 the method determines if both polarizations on each face have been measured. If not, the method returns to step 202 to complete measuring the respective voltages. If both polarizations on each face have been completed in step 206, i.e., all twelve measurements have been taken for the DUT 18, then the method advances to step 208. In step 208, the method produces an array of the 12 voltage measurements for each respective frequency that has been measured. Thus, in steps 202–208, the method obtains 12 voltage measurements from the DUT 18 for each of the six faces and two polarizations for all frequencies of interest.

In step 210, the method searches for the largest voltage measurement in each of the respective arrays. In step 212, the method determines if the highest measurement at each frequency has been found for each of the respective arrays. If the highest measurement has not been found in certain of the arrays, then the method determines if another measurement in these respective arrays of equal level has been found in step 214. If not, the method returns from step 214 to step 210 to continue searching for the largest voltage measurement in the respective arrays.

If the largest voltage measurement for each of the arrays is found in step 212, then in step 216 (FIG. 7B) the method sets the position where the highest voltage value was found for each respective array as the reference position or X position. If another equal voltage level was found in step 214 for one or more of the arrays, i.e., two voltage levels of equal value had the highest measurement in one or more arrays, then in step 218 the method selects the associated Y and Z voltage values for each of the X voltage measurements found in steps 212 and 214. This selection is based on interchanging the positive axes according to the following rotation scheme:

| X | Y | Z |
|---|---|---|
| Y | Z | X, |
| Z | X | Y. |

In step 220, the method selects the highest X voltage value by choosing the largest of the sum of the X+Y+Z voltage values for each of the two equal measurements in the respective array[s]. The method then advances to step 216 and sets the position where this highest value found as this X position. Therefore, in steps 210–220, the method has essentially found the face and polarization, i.e., the position, that produces the highest voltage measurement and has set this to be used as the reference position for evaluation. Upon completing step 216, the method advances to step 230.

In step 230, the method selects the associated Y and Z positions corresponding to the X reference position so that the three input correlation algorithm can be used. The selection is based on the rotation sequence interchanging the positive axes as described above and is performed for each of the respective frequencies. In step 232, the three voltage inputs corresponding to the X, Y, and Z positions are obtained from the array for each of the respective frequencies. In step 236 (FIG. 7C) the method receives operator input regarding the choice of data to be provided by the correlation algorithm, either a ground plane assumption or a free space assumption. Upon receiving the operator data in step 236, the method advances to step 238 and determines whether a ground plane or free space correlation has been selected.

Figure 1:
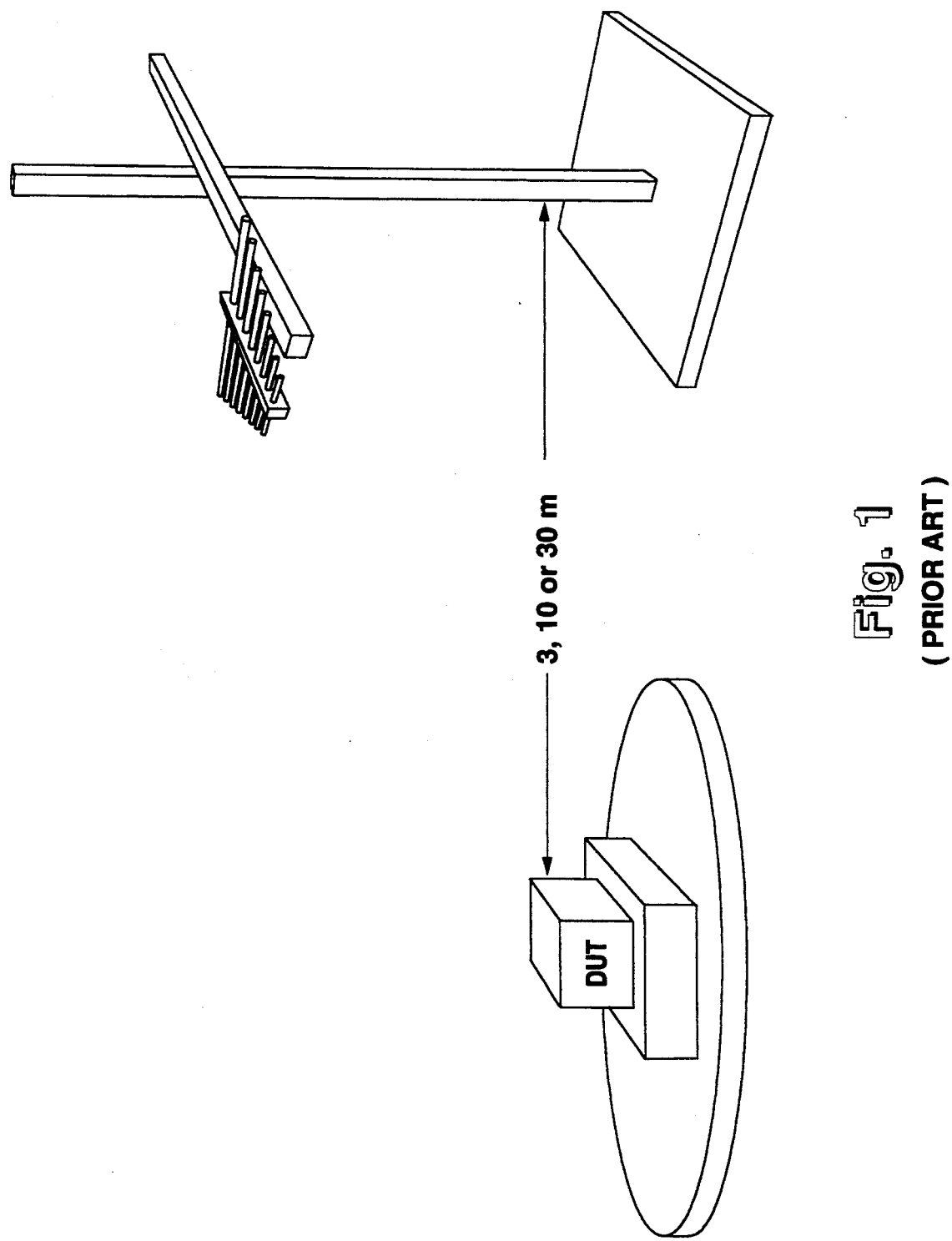
FIG. 1 is a prior art diagram illustrating an open area test site (OATS) measurement.

As recalled from FIG. 1, the conditions of measurement in a standard open field test site (OATS) are that the DUT is rotated in azimuth and an antenna performs a height search over the ground (ground plane). For some measurements, the effect of the ground plane is not obvious, and thus an option is provided to allow operator choice between a free space assumption or a ground plane assumption. The free space selection makes the assumption that the ground plane is not present, i.e., that the ground is not present. For example, some E field tests are performed using a semi-anechoic chamber which is RF absorber-lined except for the floor. Here the ground plane selection would be appropriate. In contrast, some tests are performed where all six surfaces of the chamber are lined with RF absorbers to simulate free space, and thus a free space selection should be made.

In addition, a standard antenna that is commonly used in an OATS is a horn antenna, which generally has a gain of 16 to 17 dB. This makes the antenna very directional and in many cases prevents the antenna from seeing the image antenna below the ground plane, causing a free space answer to be obtained. In these instances, it is desirable to obtain data based on a free space assumption.

Stated another way, complications arise due to the nature of the antenna that is being used for the accomplishment of the real world measurements on an OATS. If the recommended antenna, a horn antenna, is being used for the real world measurement, comparison measurements as computed by the correlation algorithm will need to have the effect of the ground plane removed from the measurement, as the horn antenna used for receiving is too directional to see the reflected component. On the other hand, if a lower gain antenna such as a log periodic antenna is used, the effect of the ground plane should be included.

Another issue that arises is that if the log periodic is used as the receiving antenna, it will "see" the direct path and ground plane reflection path signals at the lower heights of the required one to four meter search heights. As the height is increased, the log periodic antenna may not see the direct path signal and may see the reflection path signal and finally may not see either. Since the correlation algorithm output is sensitive to the receiving antenna characteristic, the correlation algorithm for this case may have to have a correction for this issue.

If a ground plane correlation is selected, then the method advances to step 240 where it performs the 3 input correlation algorithm based on a ground plane assumption for the voltages from the selected X, Y and Z positions for each of the frequencies of interest. If a free space correlation is selected in step 238, then the method performs a free space correlation with the voltages from the selected X, Y and Z positions in step 242 for each of the frequencies of interest. Upon performance of the correlation algorithm in either of steps 240 or 242, the correlation completes in step 244. Upon obtaining the E field results from the 3-input correlation algorithm, the method then computes the power required to be provided to the dipole to produce the equivalent E field radiation in step 246. This power is then provided as an output to be compared against specification limits and the resulting data is displayed in step 248.

For more information on the correlation algorithm performed in steps 240 or 242, please see Wilson, Hansen and Koenigstein, referenced above. The correlation algorithm performed in steps 240 or 242 is also available in a software routine provided by EMCO Corporation which can be reached at P.O. Box 1546, Austin, Tex. 78767 and at telephone number (512) 835-4684.

Thus, the 12 position measurement comprises the measurement of all six faces of a hypothetical cube enclosing the DUT in both polarizations. Once the twelve measurements are made, the highest value measured is set as the X, or reference measurement. Since all faces are measured for both polarizations, the information necessary to compute the three inputs for starting the correlation algorithm are available from the prior measurements. Given a specific order of measurements, the corresponding Y and Z measurements can be extracted from the 12 position measured data. These three measurements, with the other appropriate data, are input to the three input correlation algorithm. Since the presumption is that the DUT emitter 18 is a tuned dipole, the correlation algorithm produces accurate results.

Therefore, the assumption that the DUT 18 has gain no greater than a dipole is still inherent in the correlation algorithm. In addition, the assumption is made that the DUT 18 will produce an emanation that can be captured by twelve measurements (six faces of the DUT at two polarizations per face).

Second Embodiment

Figure 8A:
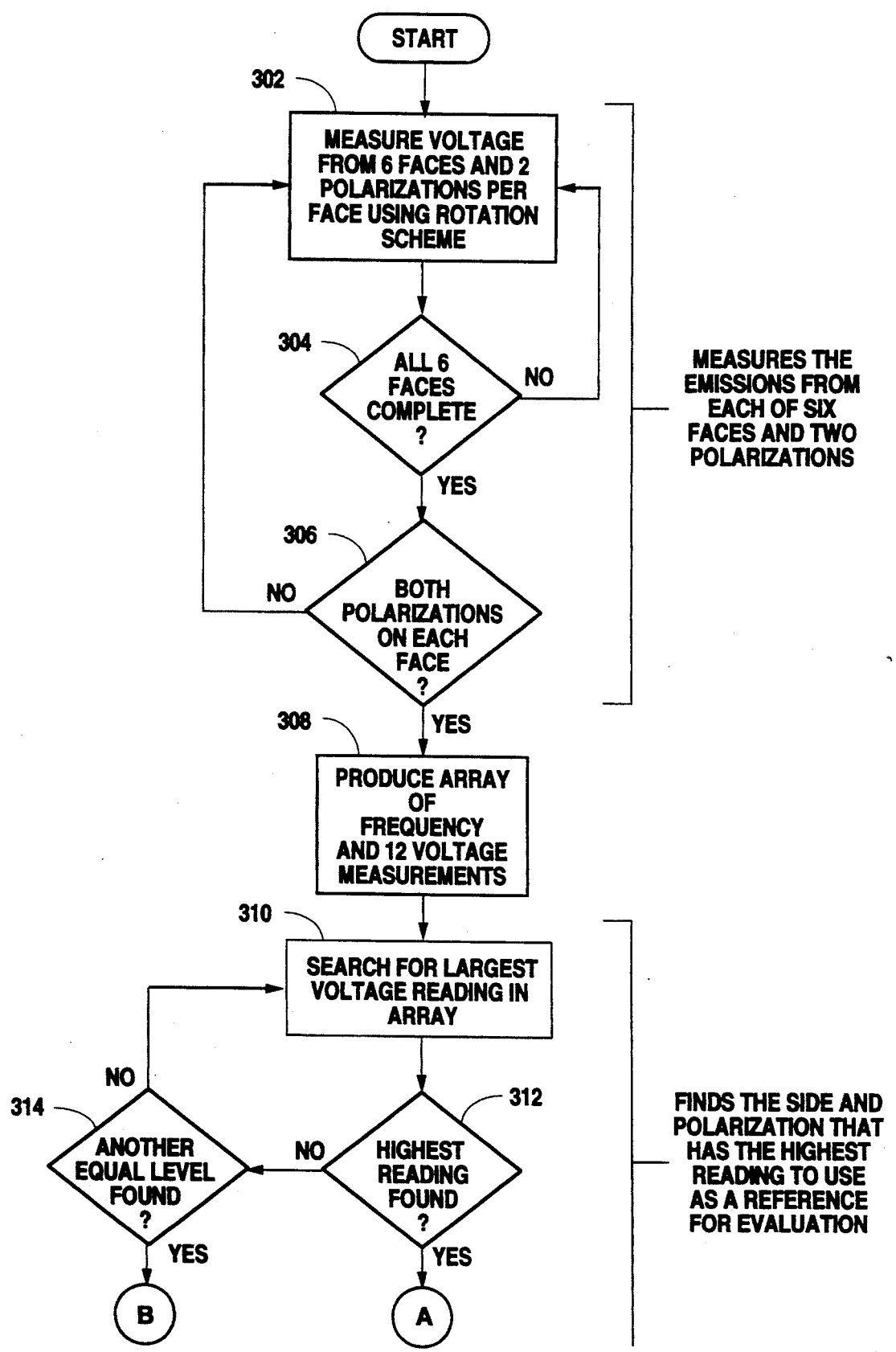
FIGS. 8A-8E are flowchart diagrams illustrating operation of the correlation method according to a second embodiment of the present invention.
Figure 8B:
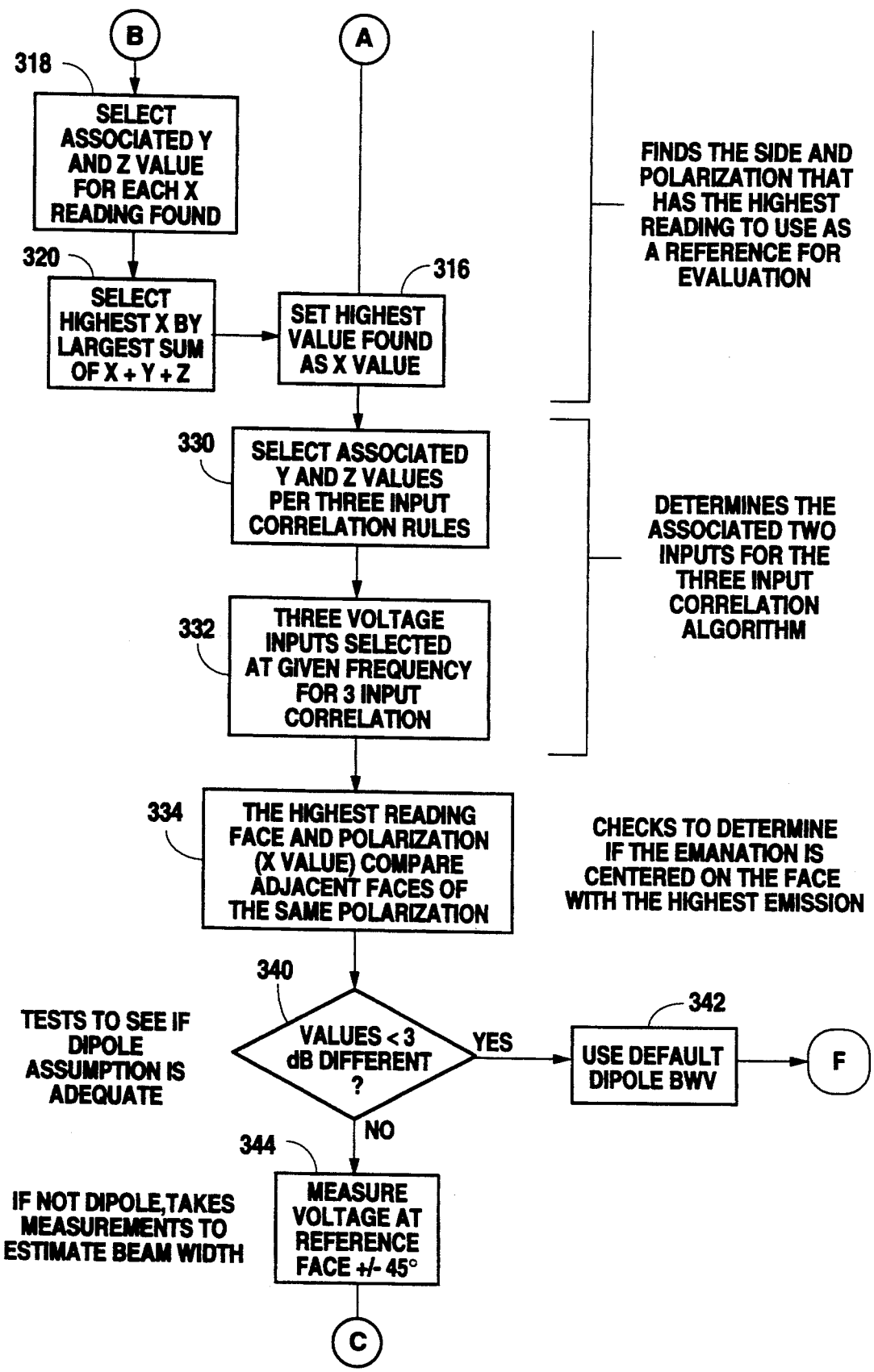

Referring now to FIGS. 8A–BE, the method according to the second embodiment is shown. FIG. 8 is shown in five portions referred to as FIGS. 8A, 8B, 8C, 8D and 8E, and interconnections of the flowchart are designated by reference to the circled letters A–G. In step 302, the correlation method measures respective voltages from a respective face and polarization for all the desired frequencies of interest using the rotation scheme described above. In step 304, the method determines if all six faces have been completed. If not, the method returns to step 302 to continue measuring the voltages from each of the respective faces. If all six faces have been completed in step 304, then in step 306, the method determines if both polarizations on each face have been measured. If not, the method returns to step 302 to complete measuring the respective voltages. If both polarizations on each face have been completed in step 306, i.e., all twelve measurements have been taken for the DUT 18, then the method advances to step 308. In step 308, the method produces an array of the 12 voltage measurements for each respective frequency that has been measured. Thus, as in steps 202–210 discussed previously, in steps 302–308, the method obtains 12 voltage measurements from the DUT 18 for each of the six faces and two polarizations for all frequencies of interest.

In step 310, the method searches for the largest voltage measurement in each of the respective arrays. In step 312, the method determines if the highest measurement has been found for each of the respective arrays. If the highest measurement has not been found in certain of the arrays, then the method determines if another measurement in these respective arrays of equal level has been found in step 314. If not, the method returns from step 314 to step 310 to continue searching for the largest voltage measurement in the respective arrays. If the largest voltage measurement for each of the arrays is found in step 312, then in step 316 (FIG. 7B) the method sets the highest voltage value found for each respective array as the reference position or X value. If another equal voltage level was found in step 314 for one or more of the arrays, i.e., two voltage levels of equal value had the highest measurement in one or more arrays, then in step 318 the method selects the associated Y and Z voltage values for each of the X voltage measurements found in steps 312 and 314. This selection is based on interchanging the axes according to the sequence:

| X | Y | Z |
|---|---|---|
| Y | Z | X, |
| Z | X | Y. |

In step 320, the method selects the highest X voltage value by choosing the largest of the sum of the X+Y+Z voltage values for each of the two equal measurements in the respective array[s]. The method then advances to step 316 and sets the highest value found as this X value. Therefore, as in steps 210–220 described above, in steps 310–320 the method has found the face and polarization, i.e., the position, that produces the highest voltage measurement and has set this to be used as the reference position for evaluation. Upon completing step 316, the method advances to step 330.

In step 330, the method selects the associated Y and Z positions corresponding to the X reference position so that the three input correlation algorithm can be used. The selection is based on the rotation sequence described above and is performed for each of the respective frequencies. In step 332, the three voltage inputs corresponding to the X, Y, and Z positions are obtained from the array for each of the respective frequencies.

In step 334, the method compares the adjacent faces of the same polarization with the highest measurement face and polarization, which is the X reference position determined is step 316. The adjacent faces are not the same as the Y and Z positions determined in step 330, but rather the adjacent faces are simply 90 degrees on either side of the X reference position in the same polarization. Here, the method is checking to determine if the emanation is centered on the face with the highest radiation emission. This comparison is used to determine if the dipole assumption at this frequency is accurate.

In step 340, the method determines if the values for each of these adjacent faces of the same polarization differ by less than three decibels (dB). Here, the correlation method is determining if the dipole assumption is adequate. If the values of the adjacent faces with the same polarization of the X position are within three dB of each other, then in step 342 the method sets the vertical beam width to a default dipole beam width value and advances to step 354. The default vertical beam width value is preferably 360 degrees in the vertical plane and 90 degrees in the horizontal plane, or vice versa, depending on which axis is being examined first, as is well known in the art.

Figure 8C:
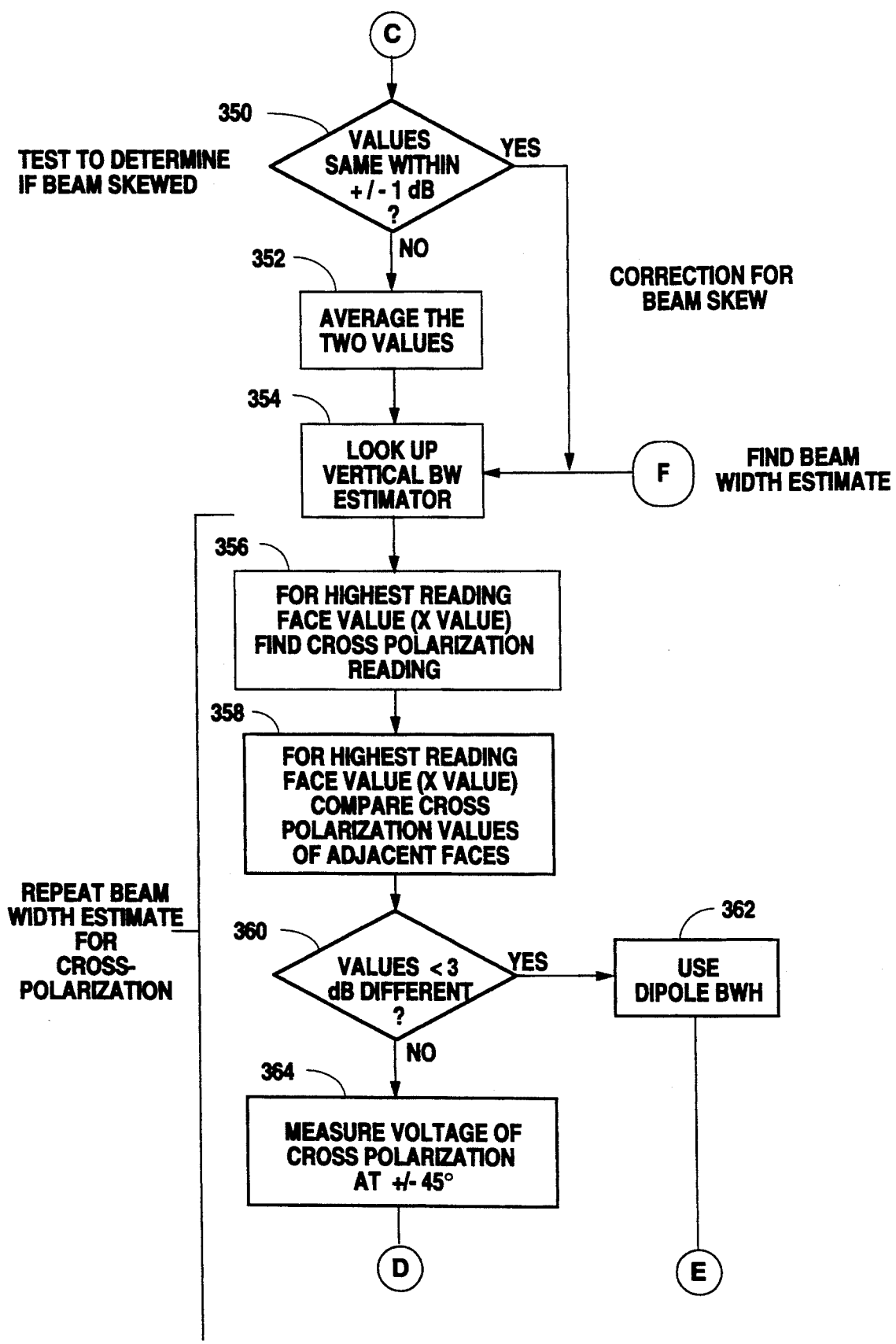

If the values differ by greater than 3 dB, then in step 344, the method measures the voltage at ±/- 45° from the reference face. Here, the DUT 18 is set to the X reference position, and the DUT 18 is then rotated 45° to either side maintaining the same polarization, and voltage measurements are taken of these emissions. These voltage measurements are taken to estimate the beam width of the emitted radiation. The method then advances to step 350 (FIG. 8C).

In step 350, the method determines if these measured values are within the same plus or minus one dB to determine beam skew. An assumption is generally made that the beam produced by the DUT 18 is pointing directly down the axis of the TEM cell toward the apex 11. However, this may not be true. Therefore, the values obtained in step 344 are compared in step 350. If the obtained values are close to each other, with ±/- 1 dB in step 350, then it is determined that the beam is pointing directly down the TEM cell axis, and the method advances to step 354.

If the obtained measurements are not within ±/- 1 dB in step 350, then the method averages the two values in step 352 and then advances to step 354. In step 354, the method looks up the vertical beam width estimate value in a vertical beam width (VBW) lookup table. The VBW look-up table essentially comprises a numerical gain associated with various beamwidths. In the preferred embodiment, the look-up table comprises the following values:

| fraction of reference face voltage at +/− 45° | | BW estimator |
|---|---|---|
| .707107 | → | 120 degrees |

-continued

| fraction of reference face voltage at +/− 45° | | BW estimator |
|---|---|---|
| .500001 | → | 90 degrees |
| .353554 | → | 75 degrees |
| .250001 | → | 66 degrees |

Here, the lefthand column represents the proportion of the reference voltage received by the TEM cell at either ±/- 45 degrees from the reference face, and the righthand column represents the beam width estimator value.

Figure 8D:
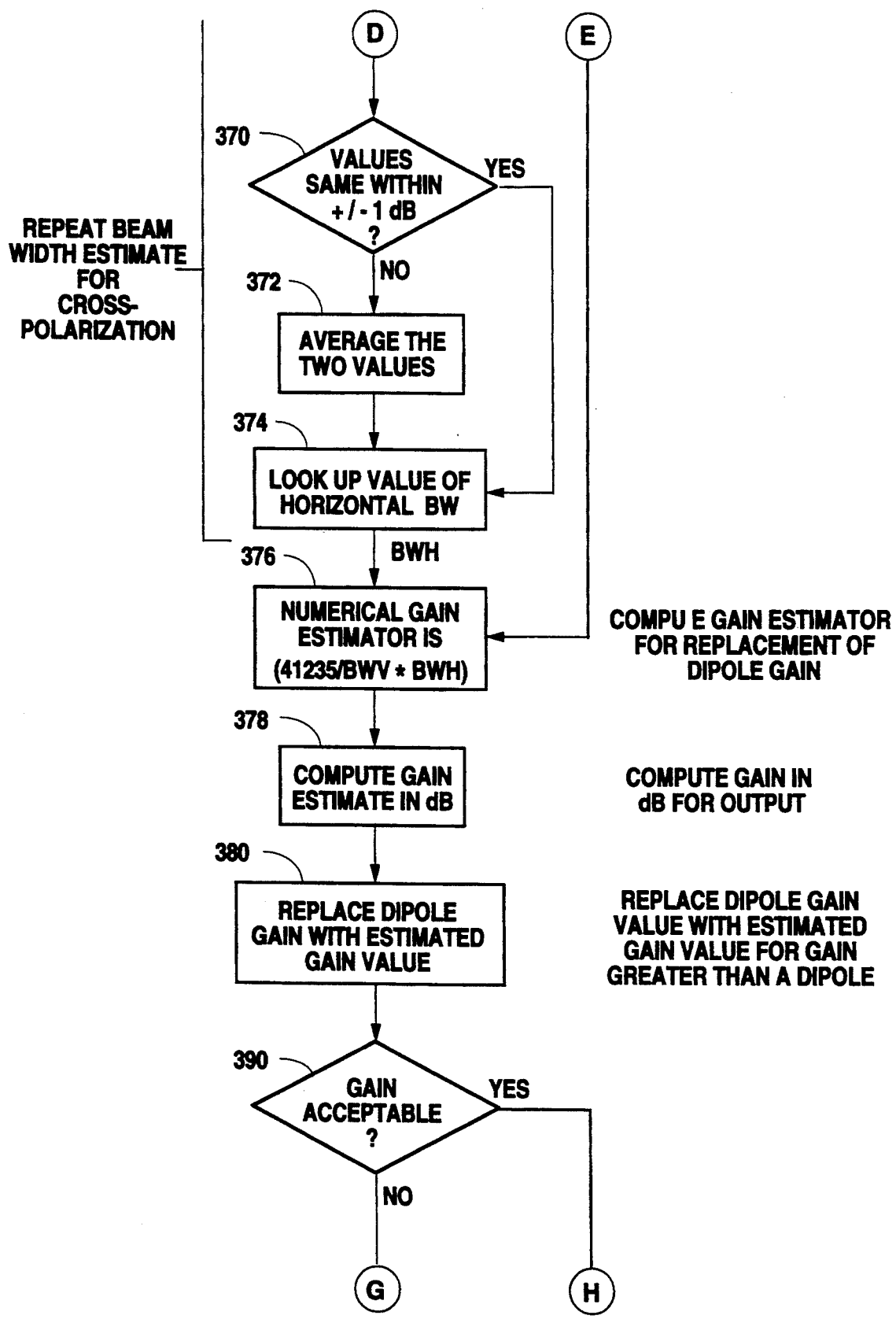

In step 356, the method finds the cross-polarization measurement for the X reference face, which is the highest measurement face value. This involves turning the DUT 18, or the hypothetical cube 40 enclosing the DUT 18, ±/- 90 degrees in the vertical plane and obtaining the measurements from these adjacent faces. In step 358, the method compares the cross-polarization values of the adjacent faces and in step 360 determines if the two values obtained in step 356 are different by less than 3 dB. If so, then a dipole assumption can be made, and in step 362 the method uses the default dipole horizontal beamwidth value and advances to step 376 (FIG. 8D). The default dipole horizontal beamwidth is preferably the same as the default vertical beamwidth used in step 342, above.

If the two values differ by greater than 3 dB in step 360, then in step 364 the method measures the voltage of the cross-polarization at ±/- 45° to compute the horizontal beamwidth. Here a measurement is being taken of the DUT at ±/- minus 45° to the cross-polarized reference position. The method then advances to step 370 (FIG. 5D). In step 370, the method determines if the respective values determined in step 364 are within in the same ±/- 1 dB. If so, then the method advances to step 374. If not, then in step 372 the method computes the average of these two values. The method then advances to step 374 where it uses a lookup table to find a value for the horizontal beam width. Here it is noted that steps 364, 370, 372, and 374 perform a similar function to steps 344, 350, 352, and 354 previously described.

The method then advances to step 376 where it computes a numerical estimate for the gain according to the equation:

$$41235 \div (BMV \times BWH).$$

For more information on this equation, please see Kraus, John D. *Antennas* McGraw-Hill 1950, ps. 11–31, and particularly page 25, which is hereby incorporated by reference. Here, the method is computing the gain estimate as a replacement for the dipole gain. In step 378, the method computes the gain estimate in dB so that it may be provided as an output. The method then advances to step 380 where it replaces the dipole gain value with the estimated gain value in the correlation algorithm for those respective frequencies where the dipole assumption was found to be inaccurate. The 3-input correlation algorithm includes a dipole expression, and this step involves removing the dB value associated with the dipole gain and replacing this dB value with the estimated gain value.

Figure 8E:
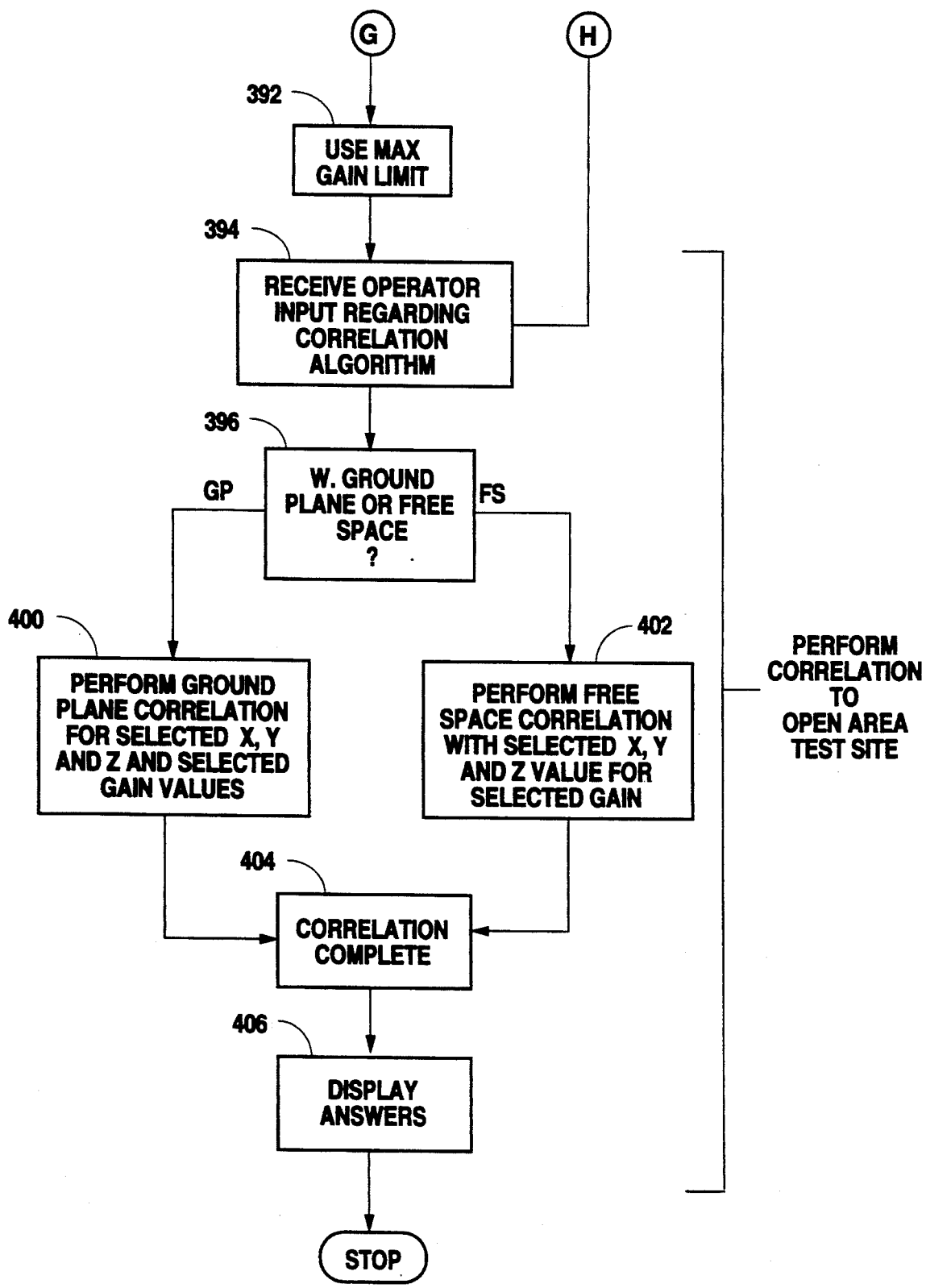

The method then advances to step 390 where it determines if the gain computed in step 378 is acceptable, i.e., if an error was made in computing the gain. If so, then the method advances to step 394 (FIG. 8E). If not, the method advances to step 392 where it uses a maximum gain limit value, preferably 10 dB.

The method then advances to step 394 where the method receives operator input regarding whether to use a free space or ground plane assumption. Upon receiving this input data, the method advances to step 396 and determines whether a ground plane or free space correlation has been selected. The appropriate factors that should be considered in selecting either a ground plane or free space assumption are discussed above with regard to steps 236 and 238.

If a ground plane correlation is selected, then the method advances to step 400 where it performs a ground plane correlation for selected X, Y and Z and the selected gain values. If a free space correlation is selected in step 396, then the method performs a free space correlation with the selected X, Y and Z value and for the selected gain value in step 402. Upon completion of either steps 400 or 402, the correlation completes in step 404 and the answers are displayed in step 406.

For information on this three input correlation algorithm, please see Wilson, Hansen and Koenigstein, referenced previously. Also, the correlation algorithm that is performed in steps 400 or 402 is available in a software routine provided by EMCO Corporation which can be reached at P.O. Box 1546, Austin, Tex. 78767.

Therefore, the method according to the present invention measures 12 different positions of a DUT to determine the position that produces the highest amount of radiation. Once the respective face and polarization that produces the highest emanation for the respective frequency are identified, the method physically relocates the DUT such that this face and polarization are the reference face and polarization. The method then obtains voltage measurements from two other positions for the three-input correlation algorithm.

In a first embodiment, the method then correlates these three voltage inputs into E field data. In a second embodiment, the method determines if a dipole assumption is accurate and, if not, the gain of the DUT is calculated using measurements of the vertical and horizontal beam widths. From this information the method estimates directivity of the emanation. Since the input power and the efficiency of the radiating element do not change, the directivity is an estimator of the gain of the radiating element. This gain is then used in the correlation algorithm to produce more accurate E field measurements.

The foregoing disclosure and description of the invention are illustrative and explanatory thereof, and various changes in the size, shape, materials, components, and devices as well as in the details of the construction and method of operation may be made without departing from the spirit of the invention.

I claim:

1. A method for computing electric field equivalent measurements for a device under test from voltage measurements obtained by measuring electromagnetic emissions from the device under test in a TEM cell, the method comprising:

measuring voltages produced by the device under test in the TEM cell from a plurality of positions of the device under test in the TEM cell for a plurality of frequencies;

determining the position of the device under test that produces the largest voltage measurement for a respective frequency after said step of measuring, said position being designated as a reference position;

selecting additional voltage measurements from other measured positions based on said reference position for said respective frequency;

determining if the device under test can be accurately modeled as a radiating element with a gain no greater than a dipole for said respective frequency after said step of selecting;

calculating the gain of the device under test for said respective frequency if the device under test cannot be accurately modeled as a radiating element with a gain no greater than a dipole; and correlating said largest voltage measurement and said additional voltage measurements using said calculated gain for said respective frequency to obtain electric field equivalent measurements for the device under test if the device under test cannot be accurately modeled as a radiating element with a gain no greater than a dipole.

2. The method of claim 1, wherein the device under test is modeled as a hypothetical cube having six faces and two polarizations for each face and wherein said step of measuring measures voltages produced by the device under test in the TEM cell from each of said six faces and two polarizations of said hypothetical cube for said plurality of frequencies;

wherein said reference position includes a reference face and polarization of said hypothetical cube for said respective frequency.

3. The method of claim 2, wherein said step of gain calculating includes calculating the beam width of emanation from the device under test for said respective frequency and calculating said gain based on said calculated beam width.

4. The method of claim 3, wherein said beam width calculating includes measuring voltages produced in the TEM cell by the device under test positioned a first number of degrees to each side of said reference face in both polarizations to calculate vertical and horizontal components of said beam width.

5. The method of claim 4, wherein said beam width calculating further includes:

comparing said measured voltages produced in the TEM cell by the device under test positioned said first number of degrees to each side of said reference face to determine beam skew; and averaging said measured voltages produced in the TEM cell by the device under test positioned said first number of degrees to each side of said reference face if beam skew is determined.

6. The method of claim 4, wherein said step of gain calculating uses the equation:

41235/(vertical beam width × horizontal beam width) in calculating said gain.

7. The method of claim 2, wherein said step of position determining determines the face and polarization that produces the largest voltage measurement for said respective frequency.

8. The method of claim 2, wherein said step of radiation element modeling determining includes measuring voltages from the device under test on faces adjacent to said reference face and comparing said adjacent face measurements.

9. The method of claim 8, wherein said step of radiation element modeling determining further includes determining if said adjacent face measurements are within a certain range of each other.

10. The method of claim 8, wherein said step of radiation element modeling determining further includes measuring voltages from the device under test on faces adjacent to said reference face at both polarizations of said reference face and comparing said adjacent face measurements at each of said polarizations.

11. The method of claim 1, wherein said step of correlating utilizes a 3-measurement 3-input correlation algorithm.

12. The method of claim 1, said step of correlating further comprising:

receiving operator input regarding either a free space or ground plane assumption; and correlating said reference voltage and said additional voltages using either said received free space or ground plane assumption.

13. The method of claim 1, further comprising:

displaying said electric field equivalent measurements.

14. A system for computing electric field equivalent measurements for a device under test, comprising:

a transverse electromagnetic (TEM) cell, wherein the device under test is situated within said TEM cell and wherein the TEM cell produces voltage measurements by measuring electromagnetic emissions from the device under test from a plurality of positions in said TEM cell for a plurality of frequencies;

storing means coupled to said TEM cell and receiving said voltage measurements for storing said voltage measurements;

modeling determining means coupled to said storing means for determining if the device under test can be accurately modeled as a radiating element with a gain no greater than a dipole for said respective frequency;

gain calculating means coupled to said modeling determining means and said storing means for calculating the gain of the device under test for said respective frequency; and correlating means coupled to said gain calculating means, said modeling determining means, and said storing means for correlating certain of said voltage measurements using said calculated gain to obtain electric field equivalent measurements for the device under test for said respective frequency;

wherein said gain calculating means and said correlating means operate if the device under test cannot be accurately modeled as a radiating element with a gain no greater than a dipole.

15. The system of claim 14, further comprising:

position determining means coupled to said storing means for determining the position of the device under test that produces the largest voltage measurement for a respective frequency, said position being designated as a reference position; and selecting means coupled to said position determining means and said storing means for selecting additional voltage measurements from other measured positions based on said reference position for said respective frequency;

wherein largest voltage measurement and said additional voltage measurements comprise said certain voltage measurements correlated by said correlating means.

16. The system of claim 15, wherein said device under test is modeled as a hypothetical cube having six faces and two polarizations for each face and wherein said measuring means measures voltages produced by the device under test from each of said six faces and two polarizations of said hypothetical cube for a plurality of frequencies;

wherein said reference position includes a reference face and polarization of said hypothetical cube.

17. The system of claim 16, wherein said position determining means determines the face and polarization that produces the largest voltage measurement for said respective frequency.

18. The system of claim 16, wherein said modeling determining means includes means for measuring voltages from the device under test on faces adjacent to said reference face and means for comparing said adjacent face measurements.

19. The system of claim 15, further comprising:
beam width calculating means coupled to said storing means for calculating the beam width of emanation from the device under test;
wherein said gain calculating means calculates said gain based on said calculated beam width if the device under test cannot be accurately modeled as a radiating element with a gain no greater than a dipole.

20. The system of claim 14, wherein said correlating means comprises a 3-measurement 3-input correlation apparatus.

21. A method for computing electric field equivalent measurements for a device under test from voltage measurements obtained by measuring electromagnetic emissions from the device under test in a TEM cell, the method comprising:
measuring voltages produced by the device under test in the TEM cell from a plurality of positions of the device under test in the TEM cell for a plurality of frequencies;
determining if the device under test can be accurately modeled as a radiating element with a gain no greater than a dipole;
calculating the gain of the device under test if the device under test cannot be accurately modeled as a radiating element with a gain no greater than a dipole; and
correlating certain of said measured voltages using said calculated gain to obtain electric field equivalent measurements for the device under test if the device under test cannot be accurately modeled as a radiating element with a gain no greater than a dipole.

22. The method of claim 21, wherein said steps of determining, calculating, and correlating are each performed for one or more of said plurality of frequencies.

23. The method of claim 22, wherein said step of gain calculating includes calculating the beam width of electromagnetic emissions from the device under test and calculating said gain based on said calculated beam width.

24. The method of claim 22, wherein the device under test is modeled as a hypothetical cube having six faces and two polarizations for each face and wherein said step of measuring measures voltages produced by the device under test in the TEM cell from each of said six faces and two polarizations of said hypothetical cube for a plurality of frequencies; the method further comprising
determining the position of the device under test that produces the largest voltage measurement for a respective frequency after said step of measuring, said position being designated as a reference position; and
selecting additional voltage measurements from other measured positions based on said reference position for said respective frequency after said step of determining;
wherein said largest voltage measurement and said additional voltage measurements comprise said certain voltage measurements used in said step of correlating.

25. A method for rotating a device under test to obtain twelve measurements of emissions from the device under test by a measuring device, wherein the device under test is modeled as a hypothetical cube having six faces and first and second polarizations for each face and further having three orthogonal axes passing through the hypothetical cube such that the faces are designated as $+X$, $+Y$, $+Z$, $-X$, $-Y$, and $-Z$ where the faces $+X$ and $-X$, $+Y$ and $-Y$, and $+Z$ and $-Z$ are at opposite faces of the cube, respectively, and wherein a diagonal axis exists in the cube from the corner where the $+X$, $+Y$, and $+Z$ faces meet to the corner where the $-X$, $-Y$, and $-Z$ faces meet, there further existing a plane horizontal to the measuring device; wherein the device under test is rotated to obtain measurements from each of the six faces and two polarizations of the hypothetical cube, the method comprising:
orienting the device under test so that face $+X$ faces the measuring device in the second polarization;
measuring emissions from the device under test from the $+X$ face in the second polarization;
rotating the device under test counter-clockwise 90 degrees in the plane horizontal to the measuring device so that face $+Z$ faces the measuring device in the first polarization;
measuring emissions from the device under test from the $+Z$ face in the first polarization;
rotating the device under test counter-clockwise 90 degrees in the plane horizontal to the measuring device so that face $-X$ faces the measuring device in the second polarization;
measuring emissions from the device under test from the $-X$ face in the second polarization;
rotating the device under test counter-clockwise 90 degrees in the plane horizontal to the measuring device so that face $-Z$ faces the measuring device in the first polarization;
measuring emissions from the device under test from the $-Z$ face in the first polarization;
rotating the device under test clockwise 120 degrees about the diagonal axis so that face $-X$ faces the measuring device in the first polarization;
measuring emissions from the device under test from the $-X$ face in the first polarization;
rotating the device under test clockwise 90 degrees in the plane horizontal to the measuring device so that face $-Y$ faces the measuring device in the second polarization;
measuring emissions from the device under test from the $-Y$ face in the second polarization;
rotating the device under test clockwise 90 degrees in the plane horizontal to the measuring device so that face $+X$ faces the measuring device in the first polarization;
measuring emissions from the device under test from the $+X$ face in the first polarization;

rotating the device under test clockwise 90 degrees in the plane horizontal to the measuring device so that face +Y faces the measuring device in the second polarization;

measuring emissions from the device under test from the +Y face in the second polarization;

rotating the device under test clockwise 120 degrees about the diagonal axis so that face +Z faces the measuring device in the second polarization;

measuring emissions from the device under test from the +Z face in the second polarization;

rotating the device under test counter-clockwise 90 degrees in the plane horizontal to the measuring device so that face +Y faces the measuring device in the first polarization;

measuring emissions from the device under test from the +Y face in the first polarization;

rotating the device under test counter-clockwise 90 degrees in the plane horizontal to the measuring device so that face −Z faces the measuring device in the second polarization;

measuring emissions from the device under test from the −Z face in the second polarization;

rotating the device under test counterclockwise 90 degrees in the plane horizontal to the measuring device so that face −Y faces the measuring device in the first polarization; and measuring emissions from the device under test from the −Y face in the first polarization.

* * * * *